(12) United States Patent
Abouda et al.

(10) Patent No.: US 7,936,200 B2
(45) Date of Patent: May 3, 2011

(54) APPARATUS AND METHOD FOR PROVIDING A CLOCK SIGNAL

(75) Inventors: Kamel Abouda, Tournefeuille (FR); Laurent Guillot, Seysses (FR)

(73) Assignee: Freescale Semiconductor, Inc., Austin, TX (US)

( * ) Notice: Subject to any disclaimer, the term of this patent is extended or adjusted under 35 U.S.C. 154(b) by 325 days.

(21) Appl. No.: 12/294,799

(22) PCT Filed: Jan. 8, 2007

(86) PCT No.: PCT/IB2007/050628
§ 371 (c)(1),
(2), (4) Date: Sep. 26, 2008

(87) PCT Pub. No.: WO2007/110786
PCT Pub. Date: Oct. 4, 2007

(65) Prior Publication Data
US 2010/0244902 A1    Sep. 30, 2010

(30) Foreign Application Priority Data
Mar. 27, 2006 (EP) .................. PCT/EP2006/004036

(51) Int. Cl.
*G06F 1/04* (2006.01)
(52) U.S. Cl. ......... 327/298; 327/291; 327/292; 327/294
(58) Field of Classification Search ................ 327/99, 327/291–294, 298
See application file for complete search history.

(56) References Cited

U.S. PATENT DOCUMENTS

| | | | |
|---|---|---|---|
| 5,438,328 A | 8/1995 | Kweon | |
| 5,828,243 A | 10/1998 | Bagley | |
| 5,867,041 A | 2/1999 | Ha | |
| 5,946,362 A | 8/1999 | Ha | |
| 6,204,711 B1 | 3/2001 | Scarlett et al. | |
| 6,282,210 B1 | 8/2001 | Rapport et al. | |
| 6,326,830 B1 | 12/2001 | Brady et al. | |
| 6,668,334 B1 | 12/2003 | Abel et al. | |
| 7,106,118 B2 * | 9/2006 | Tang et al. | 327/291 |
| 2003/0112906 A1 | 6/2003 | Pigott et al. | |
| 2005/0198549 A1 | 9/2005 | Courant et al. | |
| 2005/0206428 A1 | 9/2005 | Mondor | |
| 2005/0241362 A1 | 11/2005 | Oberle et al. | |

FOREIGN PATENT DOCUMENTS

| | | |
|---|---|---|
| DE | 4229539 A1 | 3/1994 |
| EP | 0440357 A | 8/1991 |
| WO | 2007110099 A1 | 10/2007 |

* cited by examiner

*Primary Examiner* — Lincoln Donovan
*Assistant Examiner* — Patrick O'Neill

(57) ABSTRACT

A clock circuit which may include a first clock input for receiving a first clock signal and a second clock input for receiving a second clock signal. A clock calibration unit is connected to the first clock input and the second clock input. The calibration unit may calibrate the second clock signal relative to the first clock signal. The clock calibration unit may have a calibration output for outputting a calibrated clock signal. The clock circuit may include a switch unit connected to the first clock input and the calibration output. The switch unit can select a selected clock signal selected from the first clock signal and the calibrated signal. The switch unit has a switch output for outputting the selected clock signal. A switch control unit is connected to the switch unit for controlling which signal is selected based on a selection criterion and a clock circuit output is connected to the switch unit for outputting the selected clock signal.

19 Claims, 5 Drawing Sheets

APPARATUS AND METHOD FOR PROVIDING A CLOCK SIGNAL

FIELD OF THE INVENTION

This invention relates to a clock circuit, an electronic device, a system or network, an apparatus, and a method for providing a clock signal.

BACKGROUND OF THE INVENTION

Clock circuits are generally known and used, for example, to generate a clock signal. It is known to connect a clock circuit to a signal processing circuit, which uses the clock signal as a timing signal to perform some kind of signal processing. For example it is known to connect a clock circuit to a pulse-width modulation circuit. The pulse-width modulation circuits may modulate a signal by changing the duty cycle of the signal (that is the period of time the signal has a high value relative to the total period of a signal cycle). The pulse-width modulation may be applied, for example, to convey information over a communications channel or to control the amount of power sent to a load.

However, a problem of clock circuits is that there is a risk that the clock signal is lost by the signal processing circuit. For example, the clock circuit may malfunction or the connection between the clock circuit and the signal processing circuit may be disconnected.

From United States Patent Application Publication US 2005/0206428 a clock generation module is known. The clock generation module includes a redundant clock source which can receive respective timing signals from first and second oscillator devices. The redundant clock source can generate a clock signal from the timing signals. The redundant clock source selects the respective timing signal using clock sense logic and switch logic. The clock sense logic determines signal characteristics of the timing signals and if a timing signal exhibits an undesirable characteristic the switch logics switches to the other timing signal. However, a disadvantage of the clock generation module known form this prior art document is that the local clock signal will exhibit a clock error in case the timing signals deviate from each other, which may for example lead to a loss of data. Also, the clock signal will be lost in case of a malfunction of the redundant clock source itself. Furthermore, the clock generation module includes two oscillator devices, and accordingly is relatively complex and expensive.

From United States Patent Application Publication US 2005/0198549 a data transmission chain is known. The data transmission chain includes two pieces of equipment and a transmission channel between the pieces. Data may be transmitted via the transmission channel. The transmission channel includes a path for the transmission of a clock signal. The piece at the receiving side of the equipment includes a local clock which provides a local clock signal. The local clock signal is used by the receiving side to sample the transmitted date. The local clock signal is periodically synchronised to the transmitted clock signal, that is the leading edge of the local clock signal is shifted to synchronised the local clock signal to the transmitted clock signal. However, a disadvantage of the data transmission chain known from this prior art system is that in case the transmitted clock signal is lost for a longer period of time, the local clock signal cannot be synchronised with the transmitted clock signal and accordingly the local clock signal will exhibit a clock error, which may for example lead to a loss of data.

Accordingly, a common disadvantage of the clock circuits known from the above mentioned prior art documents is that there is a relatively large risk that the clock signal is lost.

SUMMARY OF THE INVENTION

The present invention provides a clock circuit, an electronic device, a system or network, an apparatus, and a method for providing a clock signal as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings.

DETAILED DESCRIPTION OF THE PREFERRED EMBODIMENTS

Figure 1:
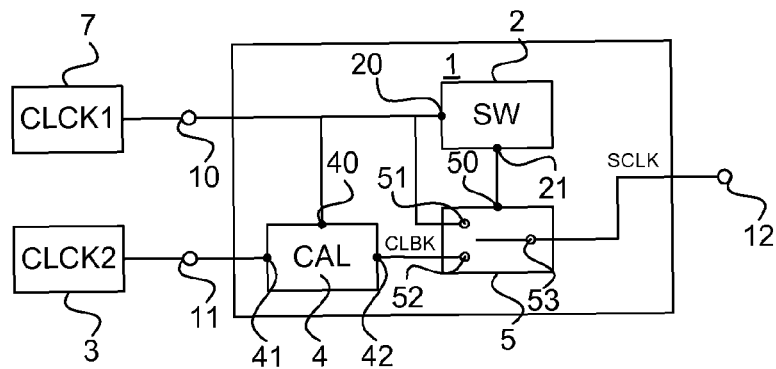
FIG. 1 shows a block diagram of a first example of an embodiment of a clock circuit.

Referring to FIG. 1, an example of a clock circuit 1 may include shown. The shown example of a clock circuit 1 includes a first clock input 10, a second clock input 11, a switch control unit 2, a clock calibration unit 4 and a switch unit 5.

As shown in FIG. 1, the first clock input 10 may for example be connected to a first clock signal source 7 and the second clock input 11 may be connected to a second clock signal source 3. At the first clock input 10 a first clock signal CLCK1 may be received. At the second clock input 11 a second clock signal CLCK2 may be received.

The clock calibration unit 4 may calibrate the second clock signal CLCK2 relative to the first clock signal CLCK1. As shown in the example of FIG. 1, the clock calibration unit 4 for instance may be connected to the first clock input 10 and the second clock input 11. As shown in FIG. 1, the clock calibration unit 4 may for instance include a first calibration input 40 at which the first clock signal CLCK1 may be received and a second calibration input 41 at which the second clock signal CLCK2 may be received. The clock calibration unit 4 may further have a calibration output 42 at which a calibrated clock signal CLBK may be outputted. Since the calibrated clock signal is calibrated to the first clock signal CLCK1, the accuracy of the calibrated clock signal CLBK may be improved compared to the accuracy of the second clock signal CLCK2. For example, the phase error or the frequency variation of the calibrated clock signal CLBK may be less than the phase error or the frequency variation of the second clock signal CLCK2.

The switch unit 5 may select a selected clock signal SCLK from the first clock signal CLCK1 and the calibrated signal CLBK. The switch unit 5 may output the selected clock signal SCLK at a switch output 53. The switch output 53 may for example be connected to a clock circuit output 12, in order to output the selected clock signal SCLK to other circuitry, units or devices, such as a modulation circuit 6 (as is explained below in more detail with reference to FIG. 2). The switch unit 5 may for example be connected to the first clock input 10 and to the calibration output 42, to receive the first clock signal CLCK1 and the calibrated clock signal CLBK. As shown in FIG. 1, the switch unit 5 may for example include a first switch input 51 connected to the first clock input 10 and a second switch input 52 connected to the calibration output 42. The switch unit 5 may, in a first state, transmit signals inputted at the first switch input 51 to the switch output 53 and inhibit a transfer of signals presented at the second input 52 to the switch output 53. In a second state, the switch unit 5 may transmit signals inputted at the second switch input 52 to the switch output 53 and inhibit a transfer of signals presented at the first input 51 to the switch output 53.

The switch unit 5 may select the first clock signal CLCK1 or the calibrated signal CLBK. Accordingly, in case for example the first clock signal CLCK1 is not available anymore or the quality of the first clock signal CLCK1 degrades below a certain level, the calibrated signal CLBK can be selected. Thus, the chance that the clock circuit 1 is unable to provide a clock signal is reduced. Furthermore, since the calibrated signal can be used as the selected clock signal SCLK, the accuracy of the clock signal SCLK outputted by the clock circuit 1 may be maintained.

The switch control unit 2 may control the selection of the clock signal, based on one or more selection criteria. The switch control unit 2 may be connected to the switch unit 5. As for instance shown in FIG. 1, an output 21 of the switch control unit 2 may be connected to a control input 50 of the switch unit 5. At the control input 50 a suitable switch control signal may be inputted by the switch control unit 2. The switch control signal may for example control the state of the switch 5 e.g. to be in the first state or to be in the second state. For instance, the switch control unit 2 may output a switch control signal with a first value, e.g. a logical zero, to control the switch 5 to be in the first state and hence select the first clock signal CLCK1. The switch control unit 2 may output a switch control signal with a second value, e.g. a logical one, to control the switch 5 to be in the second state and hence select the calibrated clock signal CLBK.

The clock signal sources 2,3 may be any type of clock signal source suitable for the specific implementation. The first and second clock signal sources 2,3 may for example include a remote clock signal source and/or a local clock signal source. For instance, the first clock input 10 may be connected to a remote clock signal source and the second clock input 11 may be connected to a local clock 300.

Figure 10:
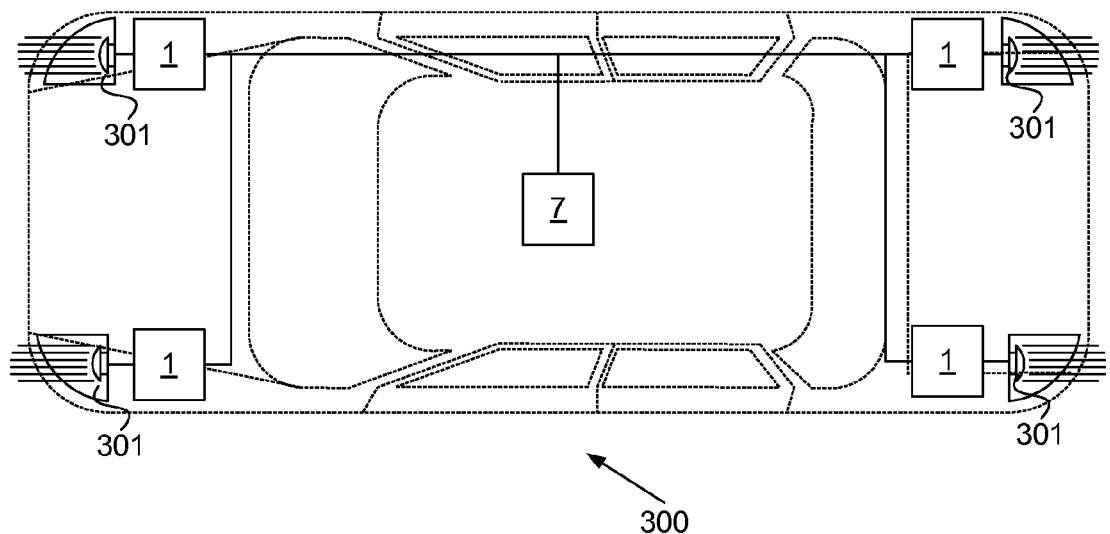
FIG. 10 schematically shows a top view of an example of an embodiment of an apparatus in which a clock circuit may be used.
Figure 11:
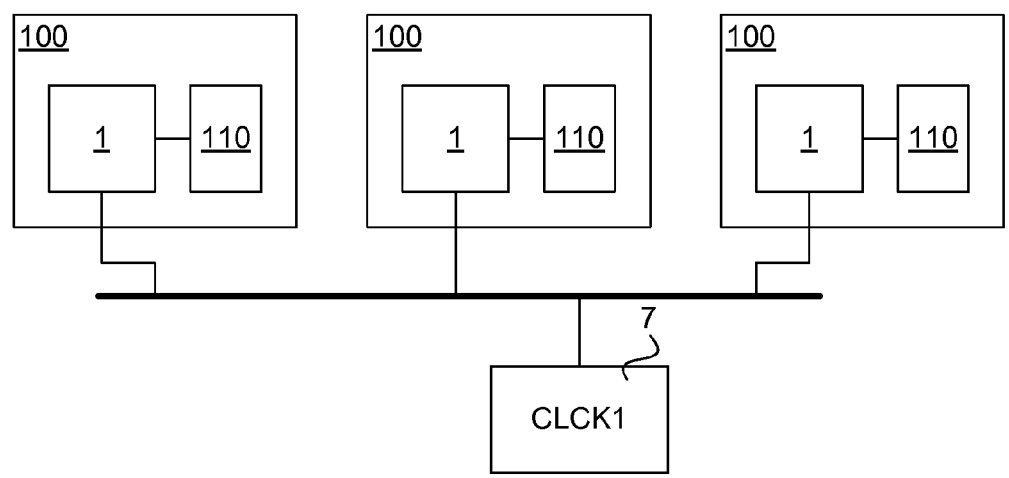
FIG. 11 shows a block diagram of an example of an embodiment of a data communication in which a clock circuit may be used.

The remote clock signal source may for example be present at another module or device than the clock circuit 1. As shown in FIGS. 10 and 11, the remote clock signal source may for example be present in a data communication network.

Figure 2:
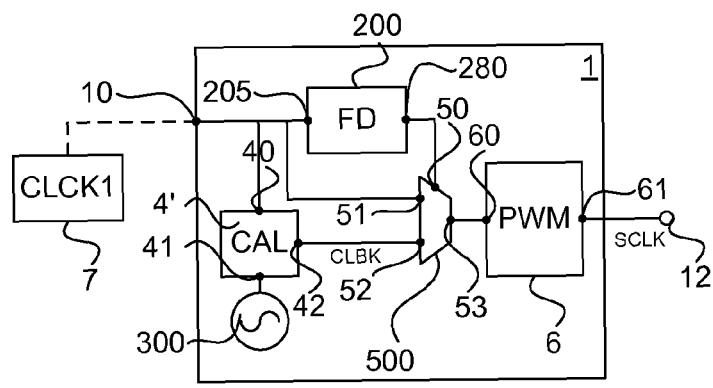
FIG. 2 shows a block diagram of a second example of an embodiment of a clock circuit.

The local clock source 300 may for example be implemented on the same piece of semiconductor material as the calibration unit, e.g. by an 'on-chip' clock. The local clock source 300 may also be implemented on a different piece of semiconductor material and e.g. be implemented in the same package as the calibration unit 1. As shown in FIG. 2 for example, the clock circuit 1 may include an oscillator which provides a clock signal CLCK2 to the calibration unit 4.

The second clock signal CLCK2 may for example have a lower accuracy than the clock signal CLCK1. For instance, the second clock signal CLCK2 may a variation in frequency of about 50% or less, such as 30% of less. The calibration unit 4 may of example calibrate the second clock signal CLCK2 such that the accuracy is improved. For example the calibration unit 4 may output a calibrated signal which has an accuracy of the same order as the ratio of the period $T_{CLCK1}$ of the first clock signal CLCK1 and the period $T_{CLCK2}$ of the second clock signal CLCK2, e.g. in the range of $T_{CLCK2}/T_{CLCK1}$. The calibrated signal may for example have a variation in frequency of about 1% or less, for instance when the second clock signal CLCK2 has a frequency of at least 100 times the frequency of the first clock signal CLCK1.

The calibration unit 4 may be implemented in any manner suitable for the specific implementation. The calibration unit 4 may for example be arranged to calibrate one or more parameters of the second clock signal CLCK2 to one or more corresponding parameters of the first clock signal CLCK1. For example the calibration unit 4 may determine a ratio of a parameter value of the second clock signal CLCK2 and the corresponding parameter value of the first clock signal CLCK1. For instance, the second clock signal CLCK2 may for example have a clock frequency lower than a clock frequency of the first clock signal CLCK1, and the calibration unit 4 may determine the number of clock cycles of the second clock signal CLCK2 that corresponds to a number of clock cycles of the first clock signal CLCK1 and hence determine the ratio of the periods of the first and second clock signals. Also, the accuracy of one or more parameters of the second clock signal CLCK2 may be lower than the accuracy of the corresponding parameter(s) of the first clock signal CLCK1. For instance, the second clock signal CLCK2 may have a larger variation in phase and/or frequency than the first clock signal CLCK1. The first clock signal CLCK1 may for example include a pulse width modulation clock signal.

Figure 3:
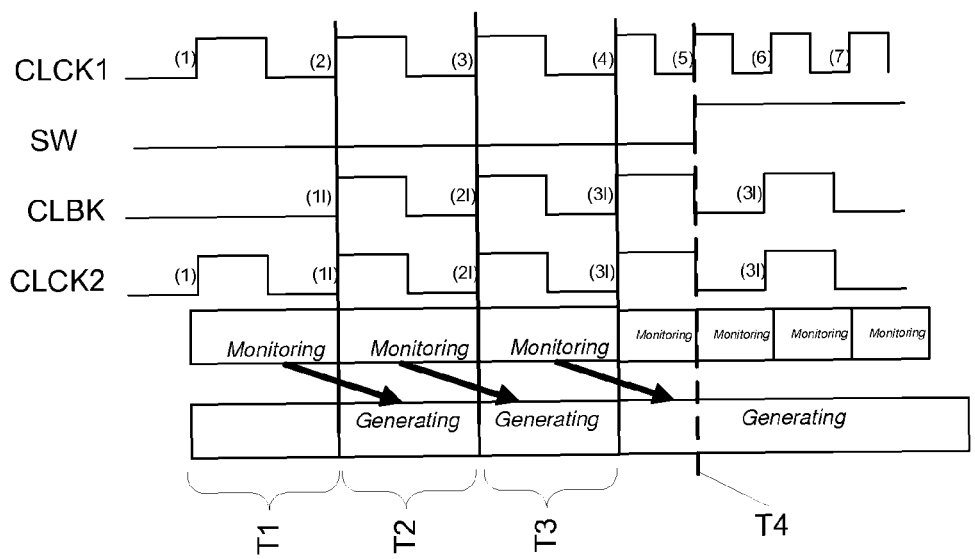
FIG. 3 shows an example of an embodiment of a timing diagram of a clock circuit.

As for instance illustrated in the example of a timing diagram shown in FIG. 3, the number of clock cycles of the second clock CLCK2 may be determined during one clock cycle of the first clock CLCK1. (In FIG. 3, the period corresponding to a clock cycle of the first clock CLCK1 is indicated with the brackets T1-T3.). The result determined during a clock cycle, e.g. during period T1, may then be used in a following clock cycle to generate the calibrated clock cycle, for example the successive period T2, as is further indicated with the arrows pointing from the block 'monitoring' to the blocks 'generating'. In case, for instance, the period of the first clock signal CLCK1 changes or another error occurs, the switch 50 may be controlled to switch to the calibrated signal CLBK, as shown by the change in signal at the time indicated with T4 in FIG. 3. The calibration unit 4 may than continue generating a calibrated signal using the calibration result obtained in the last period preceding the error, e.g. in FIG. 3 using the calibration result obtained in period T3.

Figure 4:
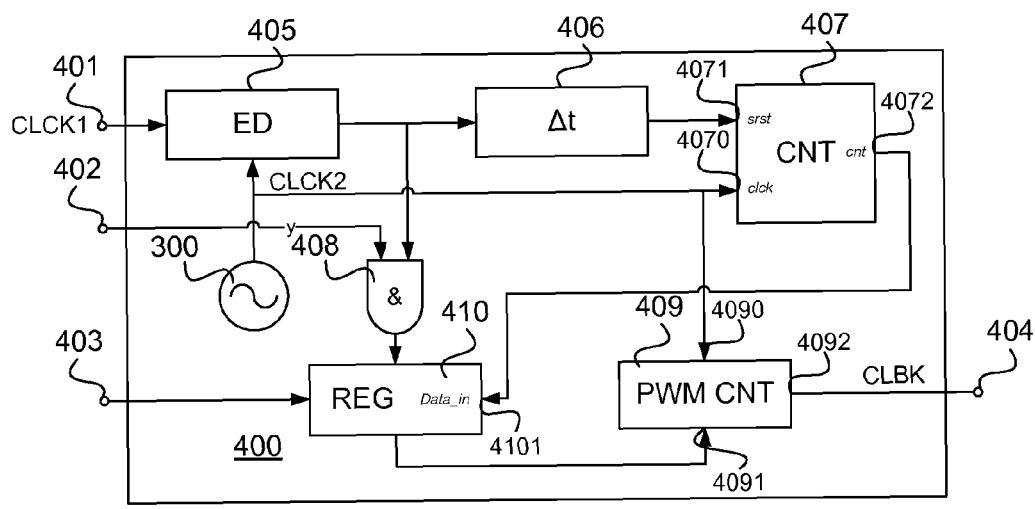
FIG. 4 shows a block diagram of an example of an embodiment of a calibration unit.

Referring to the example of FIG. 4, the calibration unit 4 may, for example, include calibration circuitry 405-407. The calibration circuitry 405-407 may calibrate the second clock signal CLCK2. The calibration circuitry 405-407 may for instance calibrate the second clock signal CLCK2 to the first clock signal CLCK1. The result of the calibration may outputted to one or more units which may generate the calibration clock signal based on the calibration result. The calibration unit 4 may, as for example shown in FIG. 4, include signal generation circuitry 409,410 which may generate the calibrated clock signal CLBK based on the result of the calibration obtained by the calibration circuitry 405-407.

As shown in FIG. 4, the calibration circuit 4 may for example be arranged to repeatedly calibrate the second clock signal to the first clock signal during a period of time the first clock signal is selected as the selected clock signal SCLK. In the example of FIG. 4, for instance, the calibration circuitry 405-47 is connected to a calibration input 401 at which the first clock signal CLCK1 may be received.

The calibration circuitry may for example include an edge detector 405 which is connected to the calibration input 401 and the oscillator 300. The edge detector 405 may synchronise the first clock signal CLCK1 and the second clock signal CLCK2 such that, for instance, after the synchronisation, a transition, e.g. a rising edge or a falling edge, of the first clock signal CLCK1 coincides with a transition of the second clock signal CLCK2, for example with a similar type or opposite type of transition. The edge detector 405 may for example output a start signal and end signal indicating a start and end of the calibration respectively. The start and end signals may for example be outputted at the beginning and the end of a clock cycle of the first clock signal CLCK1. The edge detector 405 may for instance output a signal when the first clock signal CLCK1 has a transition of a selected type, for example at each rising edge or at each falling edge of the first clock signal CLCK1. The edge detector 405 may output the start signal and the end signal, which may for instance be pulses, to a delay 406 which delays the signal with a period Δt.

The calibration unit 400 may for example include a counter 407 which can count the number of clock cycles of the second clock signal CLCK2 that correspond to a predetermine number of clock cycles, e.g. one clock cycle, of the first clock signal CLCK1. As shown in FIG. 4, the counter 407 may be connected to the delay 406. The delay signal may be presented to the counter 407 by the delay 406. The counter 407 may count the number of transitions of the second clock signal between successive signals from the edge detector 405, e.g. between a start signal and an end signal. As shown in FIG. 4, for instance, a control input 4071 of the counter 407 is connected to the edge detector 405, in this example via the delay 406. The counter 407 may be connected with a clock input 4070 to the oscillator 300 or to another second clock signal source 3. The counter 407 may have a counter output 4072 at which a counter value 'cnt' is presented.

The counter 407 may count the number of clock cycles of the signal presented at the clock input 4070, e.g. in this example the second clock signal CLCK2, and may for instance increment the counter value 'cnt' every rising or falling edge of the second clock signal CLCK2. The counter 407 can be reset by providing a reset signal 'srst' at the control input 4071. In the example of FIG. 4, for instance, the counter 407 may be reset by providing a pulsed signal at the control input 4071. Accordingly, the counter value 'cnt' may be reset by the (delayed) signal outputted by the edge detector 405. Thus, the counter 407 in the example of FIG. 4 may count the number of clock cycles between successive up going or down going transitions of the first clock signal CLCK1, and recommence the calibration when the first clock signal CLCK1 has a transition, such as a rising edge.

The counter 407 may, as shown in FIG. 4, be connected with the counter output 4072 to a register 410. In the register 410, the counter value may be stored. A default value may have been stored in the register 410 before the calibration, via an input 403 of the calibration unit 400. The counter value stored in the register may be used by a signal generator 409 to generate a calibrated signal. For instance in the example of FIG. 4, the signal generator 409 is connected with an input 4090 to the source of the second clock signal CLCK2, e.g. in this example the oscillator 300. A control input 4091 of the signal generator 409 is connected to the register 410. An output 4092 is connected to the output 404 of the calibration unit 400.

The calibration unit 400 may be arranged to output a calibrated clock signal CLBK with a frequency which is a multiple of a frequency of the first clock signal CLCK1. The signal generator 409 may output a calibrated clock signal with a period proportional to the counted number of clock cycles. The signal generator 409 may for example generate a signal with a period corresponding to the counter value times the period $T_{clck2}$ of a clock cycle of the second clock signal CLCK2. The signal generator 409 may for instance retrieve the counter value stored in the register 410 and output a signal at a first signal level, e.g. a low level, during a first period of time t1, and output a signal at a second signal level, e.g. a high level, during a second period of time t2. For instance, The first period of time t1 and the second period of time t2 may for instance have substantially the same duration, e.g. the calibrated signal may have a duty cycle of 50%. However, depending on the specific implementation the calibrated signal CLBK may also have another duty cycle.

The calibration unit 4 may be connected to the switch control unit 2. The calibration unit 4 may terminate the calibration when the calibrated clock signal is selected as the selected clock signal SCLK. For instance, the calibration unit 400 may terminate the calibration process in case the first clock signal CLCK1 exhibits a failure. The calibration unit 400, may as shown in FIG. 4, include an clock failure input 402 which may be connected to a clock failure detector 200 and receive from the clock failure detector 200 a clock failure signal which indicates whether or not the first clock signal CLCK1 has a failure. When the clock failure signal indicates that the first clock signal CLCK1 the calibration unit 4 may stop the calibration or not use the result of the calibration but continue generating the calibrated signal based on a previous calibration.

In the example of FIG. 4, for instance, the clock failure input 402 is connected to a memory controller 408. The clock failure signal may be inputted to the memory controller 408, which may control the memory or register 410 in which a calibration result is stored. In the example of FIG. 4, for instance, the memory controller 408 is connected to an input of the memory or register 410. The memory controller 408 may for example enable or disable storing a calibration result in the register 410.

For instance the memory controller 408 may protect the data stored in the register 410 in case the first clock signal CLCK1 exhibits a failure and inhibit storing the calibration result in the register 410. Accordingly, the signal generator 409 may continue to use the, previously stored, counter value 'cnt' from the register 410 to generate the calibrated signal. The frequency of the calibrated signal may thus be (within a margin of error suitable for the specific implementation) the same as the frequency of the first clock signal as determined (directly) before the first clock signal failed. Accordingly, the frequency of the selected clock signal SCLK may be maintained.

The memory controller 408 may for example include a logical AND port which is connected with the inputs to the oscillator 300 and the edge detector 405 respectively. The logical AND port may output a load signal to the register 410 when the signals inputted at the inputs are both a high value. In response to the load signal, the register 410 may store or load in the register the value presented at a data input 4101. When the signals inputted to the logical AND port are not both a high value, the register may maintain the currently stored value and not load the value presented at the data input 4101 in the register 410.

The switch control unit 2 may control the selection based on any suitable criteria. For example, the switch control unit 2 may, as shown in FIG. 1, includes an input 20 at which a selection signal may be inputted which is used by the switch control unit 2 to determine which signal is to be selected. In the example of FIG. 1, for instance, the first clock signal CLCK1 is used as a selection signal.

As shown in FIG. 2, for instance, the switch control unit 2 may include a failure detector 200 which can detect a failure of one or more parameters of a clock signal. For example, the failure detector 200 may detect whether or not a clock signal is present and control a switch unit 5 to select the calibrated signal in case the clock signal is not present. However, the failure detector 200 may also compare other aspects of the inputted clock signal with one or more suitable criteria.

The failure detector 200 may for example determine whether or not an inputted clock signal has a frequency within a predetermined range. The range may have an upper limit and/or a lower limit. The upper limit may for example be above 100 kHz, such as 200 kHz or more. The lower limit may for example be 10 kHz or lower, such as 2 kHz or. Such limits have been found to be suitable for applications in which the a PWM current is provided to a lamp, such as an incandescent light. However, it will be apparent that the failure detector 200 may be set to other ranges and/or that the switch control unit 2 may be used in other applications.

Also, the clock failure detector 200 may for example detect whether or not the duty cycle of the clock signal is within a certain range, for example within a predetermined range. The predetermined range may for example be below a maximum value, such as for instance a duty cycle of 60% or less. For instance, the clock failure detector 200 may count the period between two successive edges of different types (for instance the period between an up-going transition and a down-going transition) of the first clock signal (for instance in terms of the number of clock cycles of the second clock signal CLCK2) and compare this period with the period between two successive edges of the same type of the first clock signal (for instance the period between two successive up-going transitions).

The failure detector 200 may for example be connected to the first input 10 of the clock circuit 1 and detect failure(s) of the first clock signal CLCK1. In the example of FIG. 2, for instance, an input 205 of the failure detector is connected to the first input 10. An output 280 of the failure detector is connected to a switch unit, in this example to a control 50 of a time division multiplexer 500. The signal which is outputted by the multiplexer 500 is controlled by the signal presented at the control 50. The first input 51 of the multiplexer 500 is selected when the failure detector 200 does not output a failure signal and a second input 53 of the multiplexer 500 is selected when the failure detector 200 outputs the failure signal.

Figure 5:
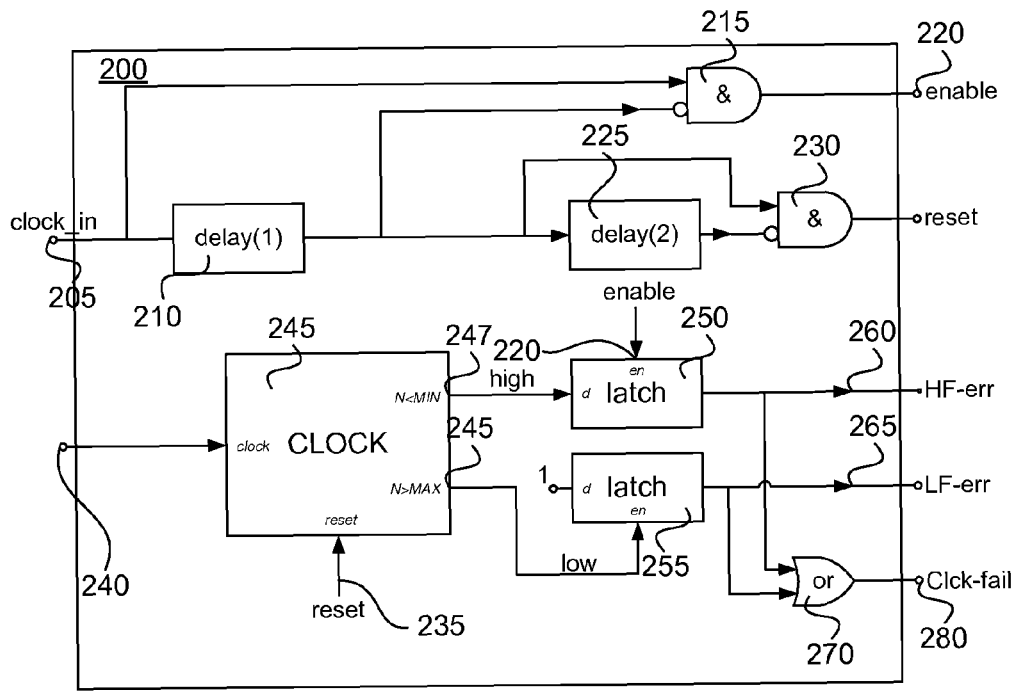
FIG. 5 shows a block diagram of an example of an embodiment of a clock failure detection unit.
Figure 5:
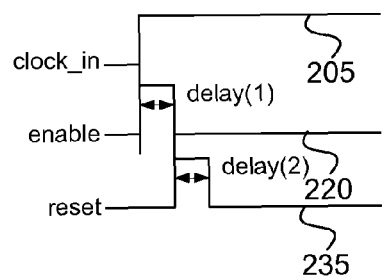

Referring now to FIG. 5, an example of a clock failure detection unit 200 is shown. An input clock signal 205 may be inputted to both a first delay 210 and one input of a NAND logic gate 215. The first delay 210 may provide a very small defined delay of the input clock signal 205 and may output the delayed clock signal to the inverted input of the NAND logic gate 215. Thus, in this manner, the NAND logic gate 215 may output a short duration pulse 220 of pulse width equal to the first delay. This short pulse 220 is hereinafter referred to as an 'enable' signal.

The output from the first delay 210, namely the delayed input clock signal, may be input to both a second defined delay 225 and one input of a second NAND logic gate 230. The second defined delay 225 may provide a further very small second delay of the delayed input clock signal and may output the further delayed clock signal to the inverted input of the second NAND logic gate 230. Thus, in this manner, the second NAND logic gate 230 may also output a delayed short duration pulse 235 of pulse width equal to the second delay 225. This second short pulse 235 is hereinafter referred to as a 'reset' signal.

For example, for instance for high frequency detection, two pulses may be generated on a rising edge of a clock input. The two pulses may for example be generated to comprise the same pulse width, with the start of the first pulse delayed by a pulse width from the start of the second pulse. The first 'enable' pulse may be used for latching a bit from a counter indicative of a clock frequency violation (for example whether a high frequency error is detected if the counter value is less than or equal to N_Min).

The second pulse may be used to reset the counter, thereby generating a new detection window, notably for a detection window of one external period clock from rising edge to rising edge. Notably, in one embodiment the second pulse may be generated with the same flip-flops that are used to latch information, to ensure that the pulse width that is generated is equal to a transition time of the flip-flop (and any combinatory logic). The transition time may be higher than the reset pulse width, or the latch enable pulse width, which may therefore track PVT variations accurately.

The clock failure detection unit 200 may comprise a counter 245 receiving a reference clock signal 240. The counter 245 may be provided with the aforementioned reset pulse 235. The counter 245 may comprise two threshold limits, namely N_Max and N_Min.

When the counter 245 counts a value for 'N' that is greater than N_Max, a signal may be outputted on a 'low output' line 248.

Similarly, when the counter 245 counts a value for 'N' that is less than N_Min, a signal may be outputted on a 'high output' line 247. The signal may indicate that a high frequency error is detected. The 'high output' line 247 may be inputted to a first latch 250, with any signal residing on the 'high output' line 247, thus being latched out of the first latch 250 by the aforementioned enable signal 220. The signal may be double latched and reported on a serial-to-parallel interface (SPI) (not shown), for example. After a correct read operation of the SPI, the first latch 250 may be unlatched if the signal (error) is removed. Thus, in operation, if there are not enough rising clock edges in a given time frame, as dictated by the counter threshold values, the first latch 250 may reset and cause an error signal on the 'high output' line 247.

Similarly, the 'low output' line 248 may be input to a second latch 255 which comprises a logic '1' input, which is latched out of the second latch 255 by any signal residing on the 'low output' line 248.

The signal latched out of the first latch 250 may indicate a high frequency error signal 260. The signal latched out of the second latch 255 may indicate a low frequency error signal 265. Both of these signals, namely the high frequency error signal 260 and low frequency error signal 265, may be input to an XOR logic gate 270, which outputs a clock failure signal 280, should there be either a high frequency error 260 or a low frequency error 265.

Thus, for instance for low frequency detection, a re-triggerable latch (otherwise known as a mono-flop) may be used. The latch may be triggered with each (i.e. both leading and trailing) clock edge. Thus, for example both leading and tracking clock edges may be used in incrementing a clock counter value can be used to detect duty cycle failure. In this manner, enable and reset pulses are generated on both the rising and falling edges of the clock_in signal 205, in contrast to using only the rising clock edge.

Counting may for example be performed both on rising edges and on trailing edges. In this regard, it is possible to identify whether a clock failure is due to a failure of the clock source to generate a reliable clock duty cycle. That is, by calculating a distance between enable/reset pulses that are generated by both rising and trailing clock edges, the circuit may be arranged to determine a first time period for a high portion of the clock pulse as well as a second time period for a low portion of the clock pulse. Thus, if the time periods are determined using a counter value, the circuit may be able to provide an indication of whether the clock provides a reliable duty cycle by comparing counter values for the high portion and low portion of the clock signal.

When precise high frequency error detection with a high frequency range limit is required, such a clock error may for instance be detected with a defined increase in the N_Min value. Thereby the clock failure detection unit may be enabled to work with an internal clock that is at a minimum N_Min times higher (or N_Min/2 times higher if counting on both edges) than the high frequency limit required.

A maximum external high frequency error detection of the aforementioned asynchronous principle depends only on the duration of the first delay 210 plus the duration of the second delay 225. The duration of the delays depends upon the flip-flop technology, for example setup/hold and transition times.

To have less than or equal to 10%, N_Min may be greater than or equal to '10'. For example, to detect a minimum of a higher frequency error of a clock running at 50 MHz with an accuracy of 10% (i.e. a clock frequency of 55 MHz would lead to an error signal), a reference clock of at least 500 MHz is used.

Figure 6:
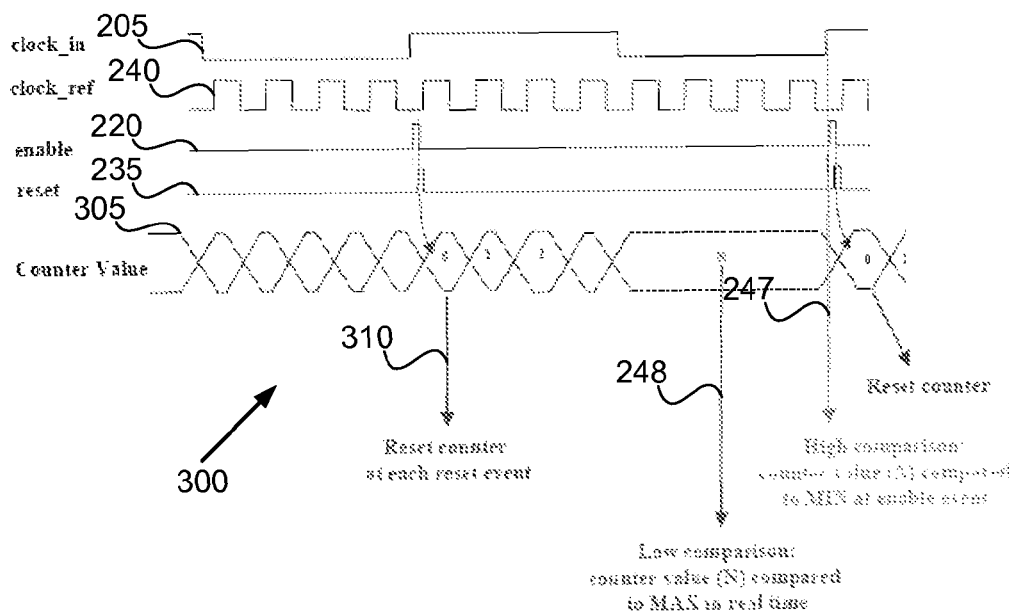
FIG. 6 shows a block diagram of a first example of an embodiment of a timing diagram of a clock failure detection unit.

Referring now to FIG. 6, a timing circuit 300 is illustrated. An input clock frequency 205 is shown at a first clock rate, which is lower than the reference clock frequency 240. When the rising edge of the input clock frequency 205 is misaligned with the rising edge of the reference clock frequency 240, an enable signal 220 may be generated, with a pulse width dictated by the first delay (say, 210 in FIG. 5). Subsequently, a reset pulse 235 is generated, with a pulse width dictated by the second delay (say, 225 in FIG. 5).

As illustrated, a counter 305 is reset 310 upon each generation of the reset signal and this may then be applied to the counter, say counter 245 of FIG. 5. FIG. 6 illustrates a timing position where a reset signal may prevent the counter 'N' to pass an N_Min value at an enable event (i.e. generation of an enable signal). Thus, a high frequency error 260 of the clock signal is therefore detected, and the subsequent reset pulse re-initialises the counter.

Figure 7:
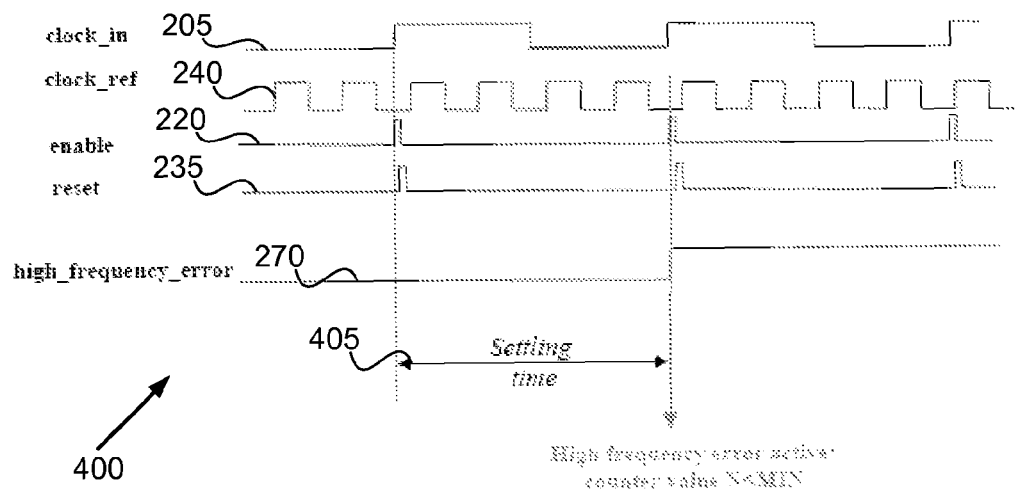
FIG. 7 shows a block diagram of a second example of an embodiment of a timing diagram of a clock failure detection unit.

Referring now to FIG. 7, an example of a timing diagram 400 is shown. An input clock frequency 205 is shown at a first clock rate, which is significantly lower than the reference clock frequency 240. When the rising edge of the input clock frequency 205 is misaligned with the rising edge of the reference clock frequency 240, an enable signal 220 is generated, with a pulse width dictated by the first delay (say, 210 in FIG. 5). Subsequently, a reset pulse 235 is generated, with a pulse width dictated by the second delay (say, 225 in FIG. 5). Thus, a determination of whether a clock failure exists can be made within one clock cycle 405 of the input clock 205.

Figure 8:
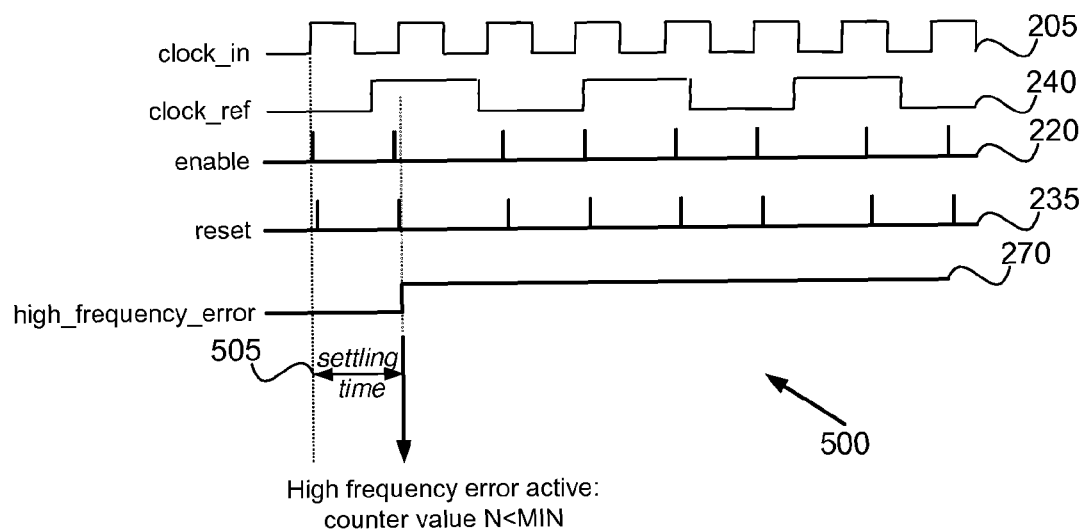
FIG. 8 shows a block diagram of a third example of an embodiment of a timing diagram of a clock failure detection unit.

Referring now to FIG. 8 an example of a timing circuit 500 is illustrated. An input clock frequency 205 is shown at a first clock rate, which is higher than the reference clock frequency 240. When the rising edge of the input clock frequency 205 is misaligned with the rising edge of the reference clock frequency 240, an enable signal 220 is generated, with a pulse width dictated by the first delay (say, 210 in FIG. 2). Subsequently, a reset pulse 235 is generated, with a pulse width dictated by the second delay (say, 225 in FIG. 2). Thus, a determination of whether a clock failure exists, when the external clock rate is higher than the reference clock frequency 240, can be made within one clock cycle 505 of the input clock 205.

Figure 9:
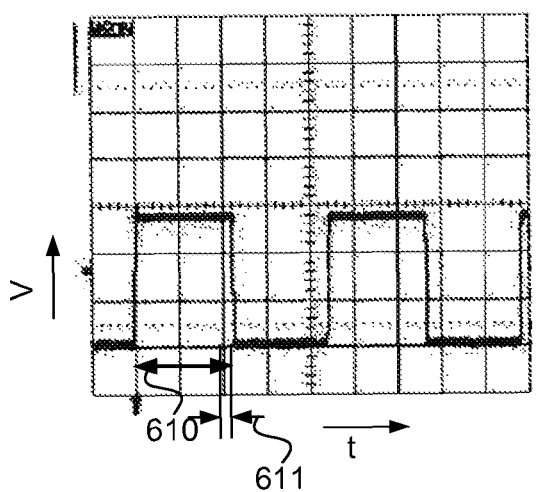
FIGS. 9A and B show graphs of an example of a modulated signal generated using a clock signal.
Figure 9:
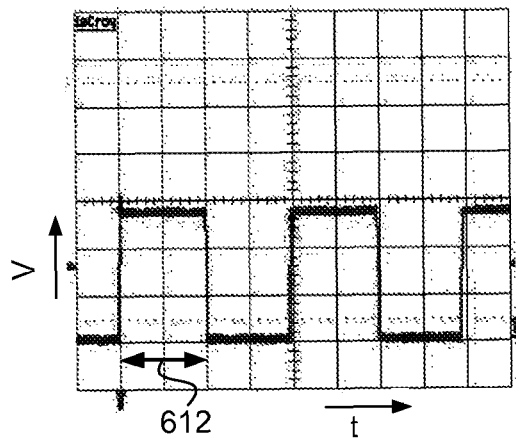

Referring to back to FIG. 2, the clock circuit 1 may include a modulation circuit 6 which can modulate the first clock signal CLCK1 and/or the second clock signal CLCK2 and/or the calibrated clock signal CLBK and/or the selected signal SCLK. In the example of FIG. 2, for instance, the modulation circuit 6 can modulated the selected signal SCLK. In the example of FIG. 2, an input 60 of the modulation circuit 6 I connected to an output 53 of the multiplexer 500. An output 61 of the modulation unit 6 is connected to an output 12 of the clock circuit 1. The modulation circuit 6 may for example include a pulse-width modulation circuit which modulates the duty cycle of the signal. Pulse-width modulation is known in the art, and for the sake of brevity the modulation circuit 6 is not described in further detail. FIGS. 9A and 9B show pulse-width modulated signals with a 50% duty cycle. FIG. 9A shows a pulse-width modulated signal generated from a local clock without calibration. FIG. 9B shows a pulse-width modulated signal generated from a local clock with calibration of the local clock to a high accuracy remote clock signal. Arrows 610,611 indicate the width of a modulation pulse. As indicated with arrow 612, without calibration the modulation pulse is about 10% wider than with calibration.

The clock circuit 1 may be incorporated any suitable apparatus or device. For instance, an electronic device may include a clock circuit 1. The electronic device may for instance be arranged to provide electrical power to another device. As shown in FIG. 10, for instance, the clock circuit may be part of a power supply network, which for example provided a controlled amount of electrical power to electrical components, such as the lights 301 of a vehicle 300. The amount of electrical power may for example be controlled by pulse-width modulation of a signal using the selected clock signal provided by the clock circuit 1. As shown in the example of FIG. 10, two or more clock circuits 1 may be connected to the same first clock signal source 7.

Referring to FIG. 11, the clock circuit 1 may be used in a network. As shown in FIG. 11, two or more clock circuits 1 may be used to provide clock signals in a system or network, for example to devices 110 connected to the respective clock circuit. As shown in FIG. 11, the network may include a remote clock 2 which is connected to two or more clock circuits 1. The first clock 2 may for example be connected to the two or more clock circuits 1 via the same wired connection, thus reducing the amount of wire required for the network.

The remote clock 2 may for example provide the first clock signal CLCK1 during a period of time after initialisation of the clock circuits 1 and be switched off after a predetermined period of time. The system or network may for example include a first clock for providing the first clock signal and a clock control unit for inhibiting transmission of the first clock signal to the clock circuits after a predetermined period of time. The period of time may for example be at least the period of time required to calibrate a local clock of the respective clock circuits 1 to the remote clock 2. The remote clock 2 may then be switched on after a certain period, in order to safeguard the accuracy of the clock signals SCLCK provided by the clock circuits 1.

The remote clock 2 may output a clock signal with a single frequency range. However, the clock signal may also have two or more frequency ranges, which may or may not have an overlap. The clock signal may also change frequency in time, and for example during a first period have a first clock frequency, during a second period have a second clock frequency etc. Thereby, for example, the need to transform the remote clock signal in each of the respective clock circuits may be obviated. The clock circuits 1 may then generate the respective calibrated clock signals by calibrating the second clock signal to the remote clock 2 when the remote clock 2 has a frequency corresponding to the frequency of the respective clock circuit 1.

For instance, in case the system is used to control lighting, for instance of a vehicle or other apparatus, the lighting may have different types of lamps, such as e.g. Light Emitting Diode (LED) arrays and incandescent lamps. In such case, for instance the remote clock 2 may during a first period have a first clock frequency suitable for the LED and during a second period a second clock frequency suitable for the incandescent lamps. Although it will be apparent that other frequencies may be used, suitable values for a LED have found to be in the range of from 20 kHz to 80 kHz, whereas for incandescent lamps suitable values have found to be in the range of 2 kHz to 200 kHz.

The clock circuit may be implemented in any manner suitable for the specific implementation. For example, the clock circuit may be implemented as a kit of parts. The kit of parts may be provided as a set of separate components which can be connected to each other to assemble, for example, a clock circuit. The clock circuit may also be implemented as data representing an integrated circuit or other hardware, for example as a set of data defining one or more masks suitable for a lithographic process in which a hardware clock circuit may be manufactured. The data may represent the hardware in any suitable manner and for example represent the date using a hardware description language or another functional description language. Additionally, the data may represent a circuit level model with logic and/or transistor gates of a clock circuit. Furthermore, the data may represent a physical placement of various devices in a hardware model. The data may represent a hardware model, such as the data specifying the presence or absence of various features on different mask layers for masks used to produce the integrated circuit. The data may be stored in any form of a machine-readable medium.

In the foregoing specification, the invention has been described with reference to specific examples of embodiments of the invention. It will, however, be evident that various modifications and changes may be made therein without departing from the broader spirit and scope of the invention as set forth in the appended claims. For example, unless expressly specified otherwise, the connections between units in the envelope detector and/or the amplifier circuit may be an type of connection suitable to transfer the signal between the units or devices. The connections may for example be direction connections or indirect connections.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. For example, the first or second clock 2,3 may include an oscillator connected to a separate circuit which controls the oscillator.

Also, devices functionally presented as separate devices may be integrated in a single physical device. For example, the clock circuit 1 may be implemented as a single integrated circuit package.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the words 'a' and 'an' shall not be construed as limited to 'only one', but instead are used to mean 'at least one', and do not exclude a plurality. The mere fact that certain measures are recited in mutually different claims does not indicate that a combination of these measures cannot be used to advantage.

The invention claimed is:
1. A clock circuit, including:
a first clock input for receiving a first clock signal;
a second clock input for receiving a second clock signal;
a clock calibration unit connected to said first clock input and said second clock input, for calibrating the second clock signal relative to said first clock signal, said clock calibration unit having a calibration output for outputting a calibrated clock signal;
a switch unit connected to said first clock input and said calibration output, for selecting a selected clock signal selected from said first clock signal and said calibrated clock signal, said switch unit having a switch output for outputting said selected clock signal;
a switch control unit connected to said switch unit for controlling which signal is selected based on at least one selection criterion;
a clock circuit output connected to said switch unit for outputting said selected clock signal.

2. A clock circuit as claimed in claim 1, wherein said switch control unit includes a failure detection unit connected to said first clock input, for controlling said switch unit to select said calibrated clock signal when a failure in said first clock signal is detected.

3. A clock circuit as claimed in claim 2, wherein said failure detection unit is arranged to detect whether a clock frequency of the first clock signal is within a predetermined range.

4. A clock circuit as claimed in claim 3, wherein said range has an upper limit and/or a lower limit.

5. A clock circuit as claimed in claim 1, wherein said calibration circuit is arranged to repeatedly calibrate the second clock signal to the first clock signal during a period of time said first clock signal is selected as said selected clock signal.

6. A clock circuit as claimed in claim 1, wherein said calibration unit is arranged to calibrate the second clock signal with a frequency which is a multiple of a frequency of said first clock signal.

7. A clock circuit as claimed in claim 6, wherein said calibration unit is arranged to output the calibrated clock signal with, within a suitable margin of error, the same frequency as the first clock signal.

8. A clock circuit as claimed in claim 1, wherein said calibration unit is arranged to count a number of clock cycles of the second clock signal during a predetermined number of clock cycles of the first clock signal.

9. A clock circuit as claimed in claim 8, wherein said calibration unit is arranged to output the calibrated clock signal with a period which is proportional to said counted number of clock cycles.

10. A clock circuit as claimed in claim 1, wherein said calibration unit is connected to said switch control unit, for terminating said calibrating when said calibrated clock signal is selected as said selected clock signal; and wherein said calibration unit is arranged to output the calibrated clock signal based on a calibration performed prior to terminating said calibration.

11. A clock circuit as claimed in claim 1, wherein said calibration unit is arranged to calibrate the second clock signal relative to a first state of the first clock signal and relative to a second state of the first clock signal.

12. A clock circuit as claimed in claim 1, wherein said second clock input is connected to a local clock, said local clock having a clock frequency lower than a clock frequency of the first clock signal.

13. A clock circuit as claimed in claim 1, wherein the first clock signal is a pulse width modulation clock signal.

14. A clock circuit as claimed in claim 1, including a modulation circuit for modulating at least one of: the first clock signal, the second clock signal and the selected signal.

15. A clock circuit as claimed in claim 14, wherein said modulation circuit is a pulse-width modulation circuit.

16. A system or network, including at least two clock circuits as claimed in claim 1.

17. A system or network as claimed in claim 16, including a first clock for providing said first clock signal and a clock control unit for inhibiting transmission of the first clock signal to said clock circuits after a predetermined period of time.

18. A system or network as claimed in claim 17, wherein said clock control unit is arranged to enable transmission of said first clock signal to said clock circuits after a predetermined period of time, during which period of time said transmission has been inhibited.

19. A method for providing a clock signal, including;
receiving a first clock signal;
receiving a second clock signal;
calibrating the second clock signal relative to said first clock signal; and
outputting a calibrated clock signal;
selecting a selected clock signal selected from said first clock signal and said calibrated clock signal;
controlling which signal is selected based on at least one selection criterion;
outputting said selected clock signal.

* * * * *